United States Patent
Maejima et al.

(10) Patent No.: US 6,788,792 B1
(45) Date of Patent: Sep. 7, 2004

(54) DEVICE FOR AMPLITUDE ADJUSTMENT AND RECTIFICATION MADE WITH MOS TECHNOLOGY

(75) Inventors: Toshio Maejima, Hamamatsu (JP); Masao Noro, Hamamatsu (JP)

(73) Assignee: Yamaha Corporation, Shizuoka-Ken (JP)

( * ) Notice: Subject to any disclaimer, the term of this patent is extended or adjusted under 35 U.S.C. 154(b) by 0 days.

(21) Appl. No.: 09/339,202

(22) Filed: Jun. 24, 1999

(30) Foreign Application Priority Data

Jun. 26, 1998 (JP) .......................................... 10-180864
Jun. 26, 1998 (JP) .......................................... 10-180865

(51) Int. Cl.$^7$ .............................. H03G 7/00; H03F 3/38
(52) U.S. Cl. ........................ 381/106; 333/10; 333/251; 333/207 A
(58) Field of Search ........................... 381/106, 83, 93, 381/117, 97; 333/14; 332/106, 109; 455/72; 330/10, 207 A, 251

(56) References Cited

U.S. PATENT DOCUMENTS

| | | | |
|---|---|---|---|
| 4,293,817 | * 10/1981 | DeMichele | 327/172 |
| 4,524,335 | * 6/1985 | Yokoyama | 332/110 |
| 5,003,196 | * 3/1991 | Kawaguchi | 327/62 |
| 5,301,023 | * 4/1994 | Zato | 348/476 |
| 5,343,161 | * 8/1994 | Tokumo et al. | 330/10 |
| 5,369,711 | * 11/1994 | Williamson, III | 381/104 |
| 5,451,900 | * 9/1995 | Haga et al. | 330/10 |
| 5,613,010 | * 3/1997 | Heyl et al. | 381/117 |
| 5,789,975 | * 8/1998 | Yoshida et al. | 330/10 |
| 6,016,075 | * 1/2000 | Hamo | 330/10 |
| 6,297,692 | * 10/2001 | Nielsen | 330/10 |

FOREIGN PATENT DOCUMENTS

| | | |
|---|---|---|
| JP | 60-203044 | 3/1984 |
| JP | 3-285405 | 3/1990 |
| JP | 7-221552 | 2/1994 |
| JP | 7-235848 | 2/1994 |

* cited by examiner

Primary Examiner—Xu Mei
(74) Attorney, Agent, or Firm—Reed Smith LLP; Stanley P. Fisher, Esq.; Juan Carlos A. Marquez, Esq.

(57) ABSTRACT

An amplitude adjustment device such as an amplitude compression device and amplitude expansion device is basically configured by a PWM modulator, a demodulator and an amplitude detector. Herein, the PWM modulator effects pulse-width modulation on an input signal to produce a pulse-width modulated signal, which is demodulated by the demodulator to produce an output signal. In addition, the amplitude detector detects an amplitude of a demodulated signal or an amplitude of the input signal to produce a control signal. A modulation factor of the pulse-width modulation is adjusted based on the control signal. In the case of the amplitude compression device, an input/output gain is changed inversely proportional to the amplitude of the input signal or amplitude of the output signal. Thus, it is possible to compress a dynamic range with respect to input/output characteristics. A full-wave rectifier, applicable to the amplitude adjustment device, is mainly configured by an inversion amplifier, an amplifier and an output section. Herein, the inversion amplifier amplifies an input signal with a gain of "−1", while the amplifier amplifies it with a gain of "1". Outputs of the amplifiers differ from each other in phases by 180°. The output section produces a full-wave rectified signal based on the outputs of the amplifiers. Incidentally, all of the amplifiers and output section are configured using field-effect transistors without using diodes being externally connected. Hence, it is possible to manufacture the full-wave rectifier in a form of an IC in accordance with the MOS process with ease.

18 Claims, 11 Drawing Sheets

FIG. 8A Vin
FIG. 8B VG1
FIG. 8C VG2
FIG. 8D Vout

FIG. 14
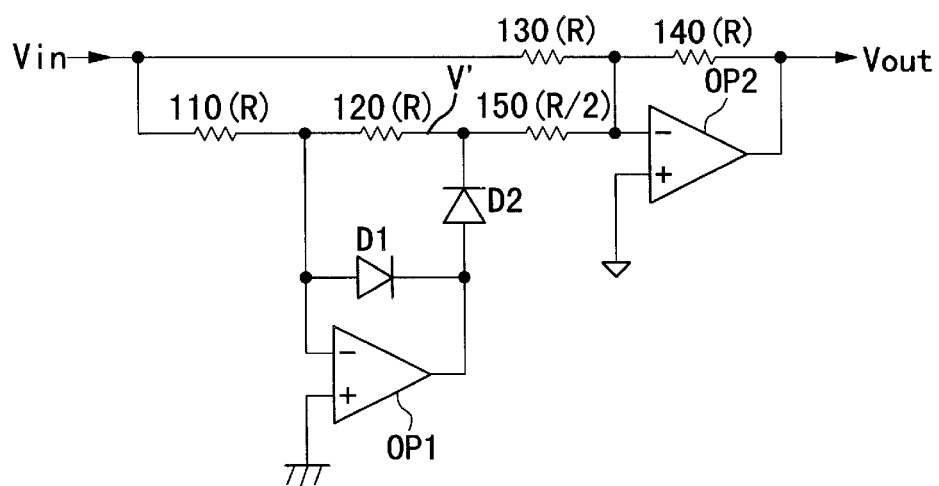
FIG. 15A  Vin
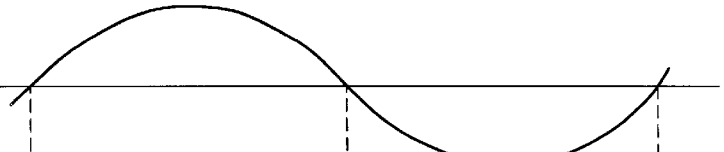
FIG. 15B  V'
FIG. 15C  Vout
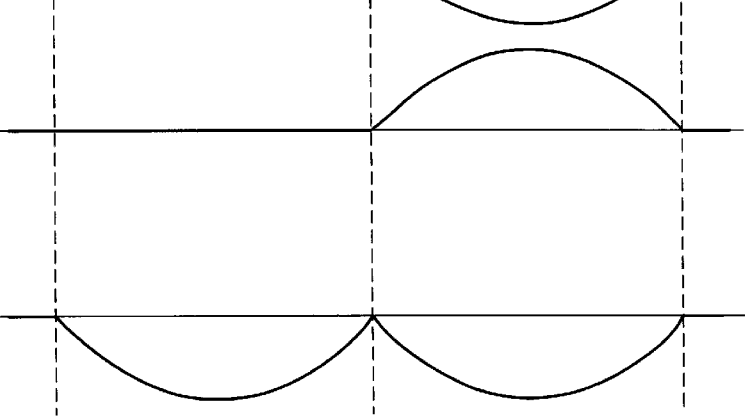

DEVICE FOR AMPLITUDE ADJUSTMENT AND RECTIFICATION MADE WITH MOS TECHNOLOGY

BACKGROUND OF THE INVENTION

1. Field of the Invention

This invention relates to amplitude adjustment devices such as amplitude compression devices and amplitude expansion devices, which are made with the MOS (i.e., Metal-Oxide Semiconductor) technology. In addition, this invention also relates to full-wave rectifiers, applicable to the amplitude adjustment devices, which are made with the MOS technology. Specifically, the devices are used for amplitude adjustment and rectification of audio inputs of digital audio systems.

This application is based on Patent Application No. Hei 10-180864 and Patent Application No. Hei 10-180865 both filed in Japan, the contents of which are incorporated herein by reference.

2. Description of the Related Art

Conventionally, amplitude compression/expansion devices are used for compressing and expanding signals of audio playback systems or audio reproduction systems. In the case of the automobiles, for example, drivers normally hear the noise due to the running of the automobiles when listening to the music which is played back with audio devices. So, if the drivers play back the music having a broad dynamic range such as the classic music, the drivers are hard to listen to piano sounds which are performed in pianissimo, for example. To improve such hardness in listening to the music in the automobiles, amplitude compression devices called "compressors" are used for the audio devices so that musical tone signals having small amplitudes are reproduced with a relatively large gain while musical tone signals having large amplitudes are reproduced with a relatively small gain.

There are provided three examples as the aforementioned amplitude compression devices, as follows:

FIG. 11 shows a circuit configuration for a first example of the amplitude compression device, which uses a voltage control amplifier. Herein, the voltage control amplifier 100 contains a multiplier, which is configured using bipolar transistors. The voltage control amplifier 100 adjusts an amplitude of an input signal Vin based on a control signal Cs. Thus, the voltage control amplifier 100 produces an output signal Vout in response to the input signal Vin. An amplitude detection circuit 110 is configured by a full-wave rectifier and a low-pass filter. The amplitude detection circuit 110 produces the control signal Cs in response to an amplitude of the output signal Vout. Normally, the bipolar transistors have base-emitter voltage characteristics, which show logarithmic characteristics. Using such characteristics, the voltage control amplifier 100 adjusts the amplitude of the input signal Vin.

FIG. 12 shows a circuit configuration for a second example of the amplitude compression device, which uses a gain switching amplifier. Herein, the gain switching amplifier 200 has a capability of switching over gains thereof based on control data Dc. In addition, an amplitude detection circuit 210 detects an amplitude of an output signal Vout. So, the amplitude detection circuit 210 produces the control data Dc in response to the detected amplitude. Incidentally, the gain switching amplifier 200 has a number of steps in changing the gains, which are called "gain steps". Herein, the number of gain steps corresponds to a number of bits of the control data Dc.

FIG. 13 shows a circuit configuration for a third example of the amplitude compression device, which uses a digital signal processor (i.e., DSP). Herein, an input signal Vin is supplied to a DSP 310 via an analog-to-digital converter (or A/D converter). The DSP 310 detects an amplitude of the input signal Vin. Then, the DSP 310 performs non-linear amplification based on the detected amplitude, thus producing output data thereof. A digital-to-analog converter 320 (or D/A converter) converts the output data of the DSP 310 to an analog signal, which is output as an output signal Vout.

The aforementioned examples of the amplitude compression devices suffer from problems, as follows:

The first example of the amplitude compression device shown in FIG. 11 is designed such that the voltage control amplifier 100 is configured using the bipolar transistors, wherein amplitude compression is performed using the logarithmic characteristics of the bipolar transistors. So, it is impossible to manufacture the amplitude compression device in a form of an IC in accordance with the MOS process (or MOS technology). For this reason, the first example of the amplitude compression device suffers from a problem in which it has a limited range of application.

In the second example of the amplitude compression device, the gain switching amplifier 200 cannot change the gains thereof in a continuous manner. Therefore, the output signal should be made discontinuous in response to gain switching timings. Thus, the second example suffers from a problem in which it cannot produce the output signal which is "smooth".

The third example of the amplitude compression device uses the DSP 310, which requires conversion from analog signals to digital signals and conversion from digital signals to analog signals. For this reason, the third example suffers from a problem in which it has a complicated circuit configuration.

By the way, full-wave rectifiers are known as devices that perform full-wave rectification on signal voltages to detect amplitude values of signals. FIG. 14 shows an example of a circuit configuration for the full-wave rectifier. The full-wave rectifier of FIG. 14 is mainly configured by a half-wave rectifier and an addition circuit of an inversion type. Herein, the half-wave rectifier is configured by resistors 110, 120, diodes D1, D2 and an operational amplifier OP1, while the addition circuit is configured by resistors 130, 140, 150 and an operational amplifier OP2. All of the resistors 110 to 140 have same resistance "R", while the resistor 150 has resistance of "R/2".

The half-wave rectifier is configured such that the diodes D1, D2 cancel voltage drops Vf in forward directions. Therefore, a half-wave rectified signal V' increases in a positive direction from a ground level. For example, if an input signal Vin shown in FIG. 15A is applied to the half-wave rectifier, its half-wave rectified signal V is shown in FIG. 15B.

In the addition circuit of the inversion type which is configured by the resistors 130 to 150 having the aforementioned resistances respectively, it is possible to perform addition on the input signal Vin with a gain "−1", while it is possible to perform addition on the half-wave rectified signal V' with a gain "−2". Therefore, an output signal Vout of the addition circuit is shown in FIG. 15C.

As described above, the full-wave rectifier is configured using two diodes and two operational amplifiers (OP1, OP2), wherein the half-wave rectified signal V' is produced and is mixed with the input signal Vin so that the output signal Vout is created.

The aforementioned full-wave rectifier can be applied to an audio signal processing circuit in order to detect amplitudes of reproduced audio signals, wherein processing is performed in response to the amplitudes of the reproduced audio signals. Engineers wish to manufacture such audio signal processing circuit in a form of a LSI circuit in accordance with the CMOS process (where "CMOS" is an abbreviation for "Complementary Metal-Oxide Semiconductor"). However, it is impossible to form the diodes by the CMOS process. So, there is a disadvantage in that the diodes should be provided as external components which are attached to the LSI circuit.

SUMMARY OF THE INVENTION

It is an object of the invention to provide an amplitude compression device and an amplitude expansion device, which have simple circuit configurations and which can be manufactured as ICs in accordance with the MOS process with ease.

It is another object of the invention to provide the amplitude compression device and amplitude expansion device, in which gains can be varied continuously.

It is a further object of the invention to provide a full-wave rectifier, which is configured using field-effect transistors without using diodes being externally connected.

In one aspect of the invention, there is provided an amplitude adjustment device such as an amplitude compression device and amplitude expansion device, which is basically configured by a PWM modulator, a demodulator and an amplitude detector. Herein, the PWM modulator effects pulse-width modulation on an input signal to produce a pulse-width modulated signal, which is demodulated by the demodulator to produce an output signal (and a demodulated signal). In addition, the amplitude detector detects an amplitude of the demodulated signal or an amplitude of the input signal to produce a control signal. A modulation factor of the pulse-width modulation is adjusted based on the control signal. Herein, the control signal controls a feedback value, which corresponds to a fraction of the pulse-width modulated signal and which is fed back through a negative feedback loop in the PWM modulator. In the case of the amplitude compression device, for example, an input/output gain is changed inversely proportional to the amplitude of the input signal or amplitude of the output signal. That is, the input/output gain is increased as the amplitude of the input signal (or output signal) decreases, while the input/output gain is decreased as the amplitude of the input signal (or output signal) increases. Thus, it is possible to compress a dynamic range with respect to input/output characteristics.

In another aspect of the invention, there is provided a full-wave rectifier, applicable to the amplitude adjustment device, which is mainly configured by an inversion amplifier, an amplifier and an output section. Herein, the inversion amplifier amplifies an input signal with a gain of "−1", while the amplifier amplifies it with a gain of "1". Outputs of the amplifiers differ from each other in phases by 180°. The output section produces a full-wave rectified signal based on the outputs of the amplifiers. Specifically, the output section selects either the output signal of the inversion amplifier or the output signal of the amplifier in response to every half of one period of the input signal. For example, the output signal of the inversion amplifier is selected and is used for formation of a first portion of a full-wave rectified signal in a first half duration of one period of the input signal. In addition, the output signal of the amplifier is selected and is used for formation of a second portion of the full-wave rectified signal in a second half duration. The first and second portions are combined together to form a "negative" waveform for the full-wave rectified signal in response to one period of the input signal. Incidentally, all of the amplifiers and output section are configured using field-effect transistors without using diodes being externally connected. Hence, it is possible to manufacture the full-wave rectifier in a form of an IC in accordance with the MOS process with ease.

BRIEF DESCRIPTION OF THE DRAWINGS

These and other objects, aspects and embodiments of the present invention will be described in more detail with reference to the following drawing figures, of which:

FIG. 14 is a circuit diagram showing an example of a circuit configuration for a full-wave rectifier;

FIG. 15A shows a waveform of an input signal Vin applied to the full-wave rectifier of FIG. 14;

FIG. 15B shows a waveform of a half-wave rectified signal V', which is produced by a half-wave rectifier contained in the full-wave rectifier of FIG. 14; and FIG. 15C shows a waveform of an output signal Vout, which is output from the full-wave rectifier of FIG. 14.

DESCRIPTION OF THE PREFERRED EMBODIMENTS

This invention will be described in further detail by way of examples with reference to the accompanying drawings.

[A] Embodiment 1

Figure 1:
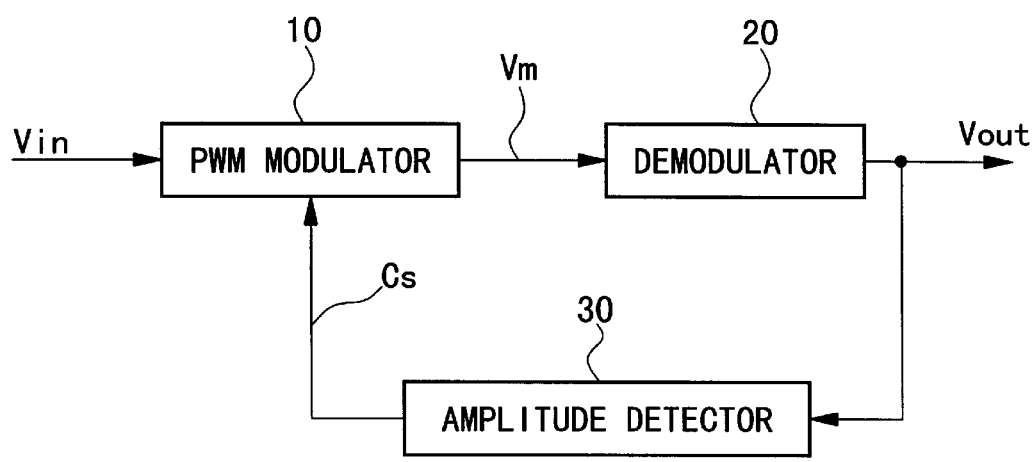
FIG. 1 is a block diagram showing an amplitude compression device in accordance with embodiment 1 of the invention.

Now, a description will be given with respect to a circuit configuration of an amplitude compression device in accordance with embodiment 1 of the invention. FIG. 1 is a block diagram showing the amplitude compression device of the embodiment 1. The amplitude compression device of FIG. 1 contains a PWM modulator 10 (where "PWM" is an abbreviation for "Pulse-Width Modulation"), a main part of which is configured by a self-sustaining oscillation circuit. Herein, the PWM modulator 10 performs pulse-width modulation on an input signal Vin in response to a modulation factor, which is determined by a control signal Cs. Thus, the PWM modulator 10 produces and outputs a pulse-width modulated signal Vm.

A demodulator 20 is configured using a low-pass filter. The demodulator 20 demodulates the pulse-width modulated signal Vm to produce an output signal Vout. The low-pass filter has "flat" frequency characteristics in a frequency band of the input signal Vin. In addition, the low-pass filter has "sufficient" attenuation characteristics in frequency ranges in proximity to a carrier frequency of the pulse-width modulated signal Vm.

An amplitude detector 30 detects an amplitude of the output signal Vout. Thus, the amplitude detector 30 produces the control signal Cs in response to the detected amplitude.

Next, details of the amplitude compression device of FIG. 1 will be described with reference to FIG. 2, which shows internal circuit configurations of the circuit blocks 10, 20 and 30.

The PWM modulator 10 is configured by an operational amplifier 11, buffers 12 to 14, resistors R1 to R5 and capacitors C1, C2. Herein, two source voltages, i.e., positive source voltage vh and negative source voltage vl, are applied to the buffer 13, wherein those voltages can be adjusted. In addition, the buffer 14 is equipped with a positive output terminal and a negative output terminal.

Figure 2:
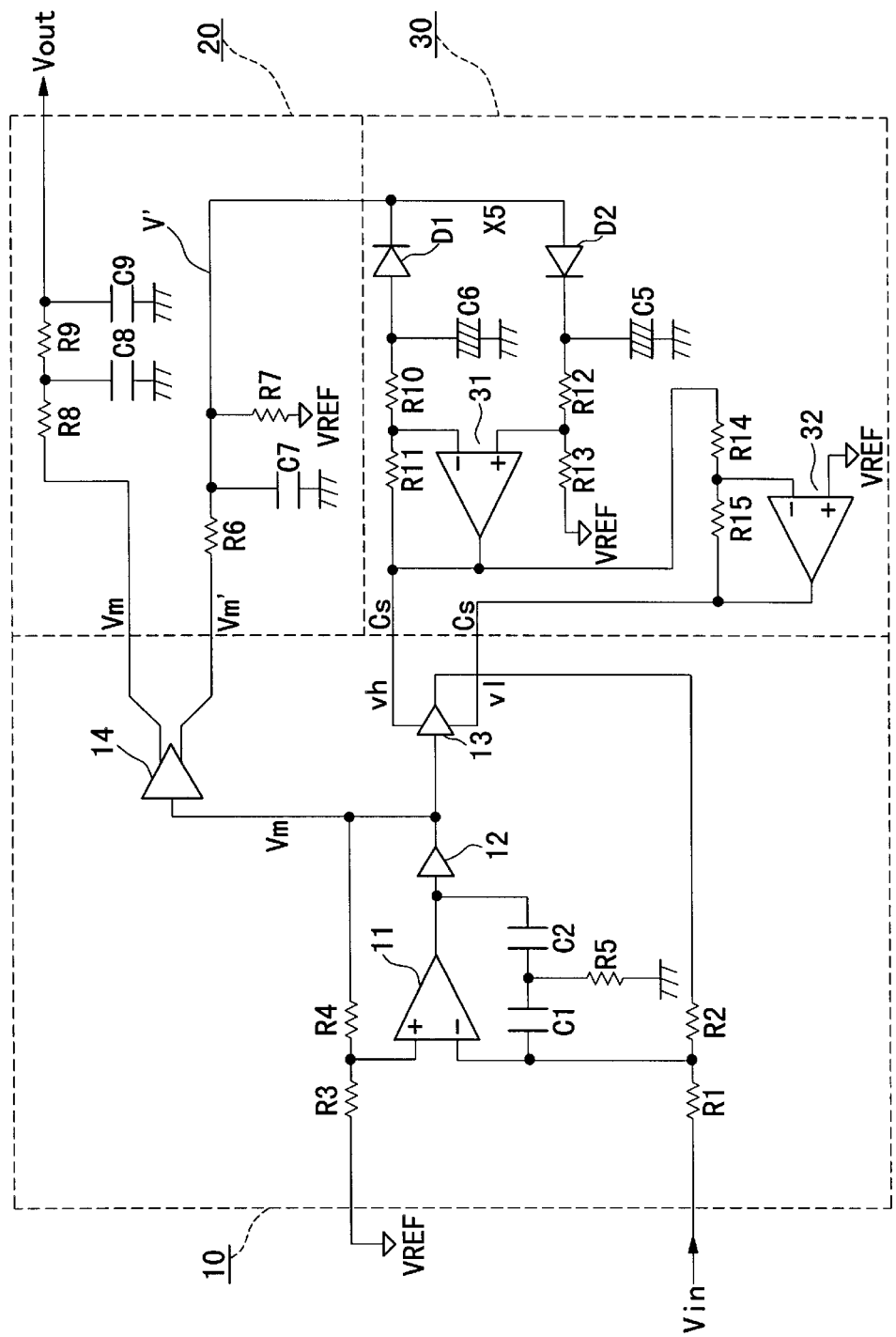
FIG. 2 is a circuit diagram showing a circuit configuration of the amplitude compression device of FIG. 1.

In the PWM modulator 10 shown in FIG. 2, the resistor R4 is inserted between an output terminal of the buffer 12 and a non-inverting input of the operational amplifier 11. So, an output of the buffer 12 is subjected to voltage division by the resistors R4 and R3. Thus, a fractional output, which is divided, is fed back to the noninverting input of the operational amplifier 11. A high-pass filter configured by the capacitors C1, C2 and the resistor R5 is provided between an inverting input and an output terminal of the operational amplifier 11. Therefore, high-frequency components of an output of the operational amplifier 11 are fed back to the inverting input of the operational amplifier 11. The aforementioned circuit components are assembled together to form an oscillation circuit. Herein, the output of the operational amplifier 11 is an equivalence of a result of quadratic integration which is performed on the input signal Vin and an output of the buffer 13. In addition, an output of the buffer 12 which receives the output of the operational amplifier 11 is a two-valued signal, which is given as source voltage or ground voltage.

The input signal Vin is supplied to the inverting input of the operational amplifier 11 via the resistor R1. In addition, the output of the buffer 13 is fed back to the inverting input of the operational amplifier 11 via the resistor R2. The aforementioned source voltages vh, vl applied to the buffer 13 are adjusted in response to detection results of the amplitude detector 30. The output of the buffer 13 is a two-valued signal having a high level and a low level, which correspond to the voltages vh and vl respectively. Therefore, it is possible to adjust a feedback ratio (or feedback factor) for the pulse-width modulated signal Vm, which is fed back to the PWM modulator 10 via the amplitude detector 30, in response to the voltages vh, vl. If the voltages vh, vl are reduced, a feedback value is reduced as well. In contrast, if the voltages vh, vl are increased, the feedback value is increased. Therefore, the feedback value is adjusted in response to an amplitude of the output signal Vout.

In the PWM modulator 10, a duty ratio for the output of the buffer 12 is varied in response to a voltage value of the input signal Vin so that the pulse-width modulation is effected. Herein, the modulation factor is varied in response to the feedback value of the operational amplifier 11. That is, the modulation factor increases if the feedback value decreases, while the modulation factor decreases if the feedback value increases.

The demodulator 20 is equipped with a first low-pass filter and a second low-pass filter. That is, the first low-pass filter is configured by resistors R8, R9 and capacitors C8, C9, while the second low-pass filter is configured by resistors R6, R7 and a capacitor C7. Herein, the first low-pass filter is connected to the positive output terminal of the buffer 14. So, the first low-pass filter demodulates the pulse-width modulated signal Vm to produce an output signal Vout. The second low-pass filter is connected to the negative output terminal of the buffer 14. So, the second low-pass filter demodulates an inverse (or inverted signal) Vm' of the pulse-width modulated signal Vm to produce and output a demodulated signal V'. Incidentally, the demodulator 20 can be modified such that the first low-pass filter is connected to the negative output terminal of the buffer 14 while the second low-pass filter is connected to the positive output terminal of the buffer 14. In such modification, it is possible to match an input phase with an output phase.

The first and second low-pass filters have frequency characteristics, which have "sufficient" attenuation characteristics in frequency ranges in proximity to the carrier frequency of the pulse-width modulated signal Vm. Thus, it is possible to sufficiently remove carrier frequency components, so it is possible to improve a S/N radio for the output signal Vout. In the demodulator 20, the first low-pass filter is configured in a form of second order, while the second low-pass filter is configured in a form of first order. Reasons are as follows:

The first low-pass filter is provided to obtain the output signal Vout, so it requires the sufficient attenuation characteristics. In contrast to the first low-pass filter, the second low-pass filter is provided for control. So, the second low-pass filter does not require the strict specification, which is required for the first low-pass filter.

An output of the second low-pass filter is connected to a cathode of a diode D1 and an anode of a diode D2, which are provided within the amplitude detector 30. In the amplitude detector 30, an anode of the diode D1 is connected to a capacitor C6, while a cathode of the diode D2 is connected to a capacitor C7. Herein, the diode D1 and the capacitor C6 configure a hold circuit which holds a negative peak voltage value of the demodulated signal V'. In addition, the diode D2 and the capacitor C5 configure another hold circuit which holds a positive peak voltage value of the demodulated signal V'.

In the amplitude detector 30, a subtraction circuit is configured by an operational amplifier 31 and resistors R10 to R13. The subtraction circuit subtracts the negative peak voltage value from the positive peak voltage value so as to calculate an amplitude value of the demodulated signal V'. In addition, an inverter circuit is configured by an operational amplifier 32 and resistors R14, R15. The inverter circuit inverts an output of the operational amplifier 31. Therefore, outputs of the operational amplifiers 31, 32 represent a detection result of the amplitude value of the demodulated signal V'. Those outputs are supplied to the PWM modulator 10 as the control signal Cs. Incidentally, the demodulated signal V' is produced by demodulating the inverted signal Vm' of the pulse-width modulated signal Vm. As a result, the amplitude detector 30 is capable of detecting the amplitude of the output signal Vout.

Figure 3A:
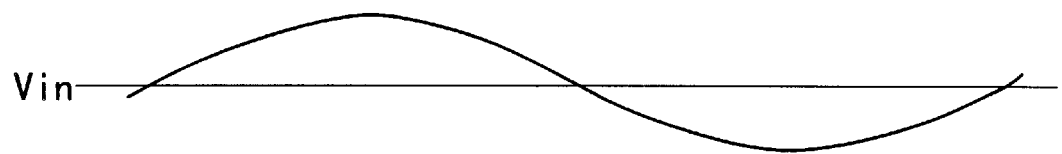
FIG. 3A shows a waveform of an input signal Vin applied to a PWM modulator shown in FIG. 2.
Figure 3B:
FIG. 3B shows a pulse-width modulated signal Vm, which is produced by the PWM modulator.

Next, a description will be given with respect to operations of the amplitude compression device with reference to time charts of FIGS. 3A, 3B, 3C and 3D. An input signal Vin shown in FIG. 3A is applied to the PWM modulator 10 shown in FIG. 2. So, the PWM modulator 10 effects pulse-width modulation on the input signal Vin to produce a pulse-width modulated signal Vm shown in FIG. 3B. Herein, a duty ratio of the pulse-width modulated signal Vm changes in response to a voltage value of the input signal Vin. That is, high-level durations of the pulse-width modulated signal Vm decrease as the voltage value decreases, while they increase as the voltage value increases. Therefore, the duty ratio of the pulse-width modulated signal Vm is adjusted by adjusting the modulation factor, so that it is possible to obtain desired input/output characteristics with respect to the PWM modulator 10.

The PWM modulator 10 outputs an inverted signal Vm', which is an inverse of the pulse-width modulated signal Vm. Such an inverted signal Vm' is supplied to the demodulator 20. In the demodulator 20, the second low-pass filter produces a demodulated signal V', shown in FIG. 3D, based on the inverted signal Vm'. The demodulated signal V' is supplied to the amplitude detector 30. Herein, the diode D1 and the capacitor C6 hold a negative peak voltage value Vb of the demodulated signal V', while the diode D2 and the capacitor C5 hold a positive peak voltage value Va of the demodulated signal V'. Then, the operational amplifier 31 calculates an amplitude value (Va–Vb) of the demodulated signal V', which is inverted by the operational amplifier 32. Thereafter, outputs of the operational amplifiers 31, 32 are supplied to the PWM modulator 10 as control signals (or control signal) Cs. Incidentally, it is possible to set a gain by adequately setting a ratio between resistances of the resistors R11, R10 and a ratio between resistances of the resistors R13, R12.

Figure 3C:
FIG. 3C shows the pulse-width modulated signal, which is given by adjusting a feedback value in the PWM modulator.
Figure 3D:
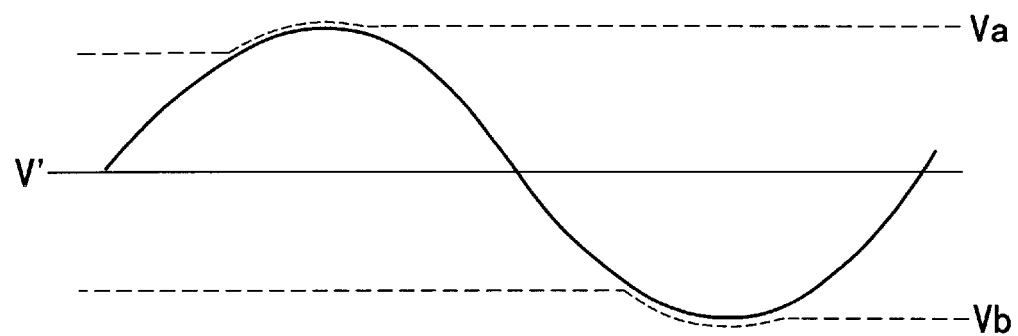
FIG. 3D shows a waveform of a demodulated signal V', which is demodulated from the pulse-width modulated signal.

The PWM modulator 10 adjusts the modulation factor thereof in response to the control signal Cs. Concretely speaking, the outputs of the operational amplifiers 31 and 32 are respectively used as the source voltages vh and vl of the buffer 13, so that it is possible to adjust a feedback value of the buffer 13. FIG. 3C shows a waveform of an output of the buffer 13 whose feedback value is adjusted.

As for adjustment of the modulation factor, if the demodulated signal V' has a large amplitude, the source voltages vh and vl become correspondingly large. As a result, the feedback value increases, so that the modulation factor decreases. On the other hand, if the demodulated signal V' has a small amplitude, the source voltages vh and vl become correspondingly small. Therefore, the feedback value decreases, so that the modulation factor increases.

Decrease of the modulation factor results in decrease of a variation rate of the duty ratio of the pulse-width modulated signal Vm against amplitude variations of the input signal Vin. On the other hand, increase of the modulation factor results in increase of the variation rate of the duty ratio of the pulse-width modulated signal Vm against the amplitude variations of the input signal Vin.

In short, it is possible to adjust a gain of the output signal Vout against the input signal Vin by adjusting the modulation factor. Herein, the modulation factor is adjusted in response to the amplitude of the demodulated signal V', which may correspond to the output signal Vout.

Figure 4:
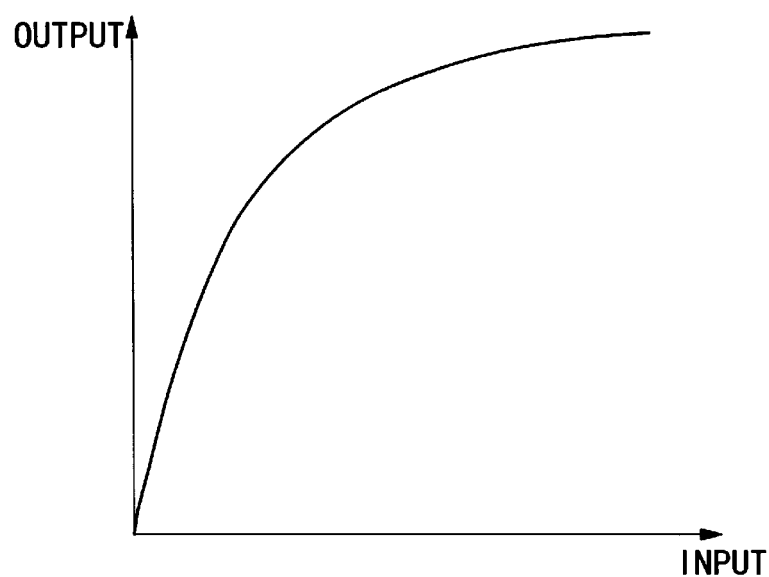
FIG. 4 is a graph showing an example of input/output characteristics of the amplitude compression device of FIG. 2.

Therefore, an overall input/output gain is adjusted in response to the amplitude of the output signal Vout. In the present embodiment, the input/output gain decreases as the amplitude of the output signal Vout increases, while the input/output gain increases as the amplitude of the output signal Vout decreases. As a result, the amplitude compression device of the present embodiment is capable of compressing a dynamic range. FIG. 4 is a graph showing a curve which represents an example of input/output characteristics of the amplitude compression device.

As described above, the amplitude compression device of the embodiment 1 operates as follows:

The pulse-width modulation is effected on the input signal Vin, wherein the modulation factor is controlled in response to the amplitude of the output signal Vout. The pulse-width modulated signal Vm is demodulated to produce the output signal Vout.

According to the embodiment 1, it is possible to obtain "non-linear" input/output characteristics without using the logarithmic characteristics of the bipolar transistors. In addition, adjustment of the modulation factor is performed by adjusting the source voltages vh, vl of the buffer 13, which feeds back the "two-valued" pulse-width modulated signal Vm. So, the amplitude compression device can be manufactured as an IC in accordance with the CMOS process with ease.

In addition, the present embodiment is capable of continuously varying the gain thereof. Therefore, it is possible to obtain the "smooth" output signal. The present embodiment does not require digital data, which are produced for control. Thus, it is possible to obtain the output signal Vout having a high quality with a simple configuration of circuitry.

Further, the present embodiment is capable of directly processing the "analog" input signal Vin without converting it to digital signal. Therefore, it is possible to manufacture the amplitude compression device without using an A/D converter, a D/A converter and/or a DSP, which are expensive.

Furthermore, the amplitude compression device of the present embodiment is designed to adjust the input/output gain by feeding back the amplitude of the output signal Vout. Therefore, it is possible to obtain non-linear characteristics with good linearity.

[B] Embodiment 2

Next, a description will be given with respect to a configuration of an amplitude compression device in accordance with embodiment 2 of the invention.

Figure 5:
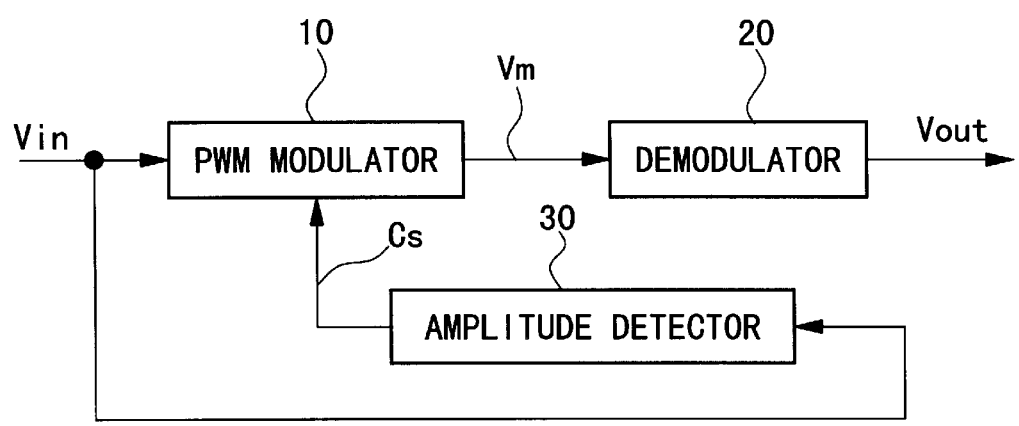
FIG. 5 is a block diagram showing a configuration of an amplitude compression device in accordance with embodiment 2 of the invention.

FIG. 5 is a block diagram showing the amplitude compression device of the embodiment 2. Like the aforementioned embodiment 1 shown in FIG. 1, the amplitude compression device of the embodiment 2 is configured by the PWM modulator 10, the demodulator 20 and the amplitude detector 30. However, different from the embodiment 1 in which the output signal Vout is detected to produce the control signal Cs, the embodiment 2 is designed such that the amplitude detector 30 detects the amplitude of the input signal Vin to produce the control signal Cs. In other words, the embodiment 1 is configured in a feedback form, while the embodiment 2 is configured in a feed-forward form.

Figure 6:
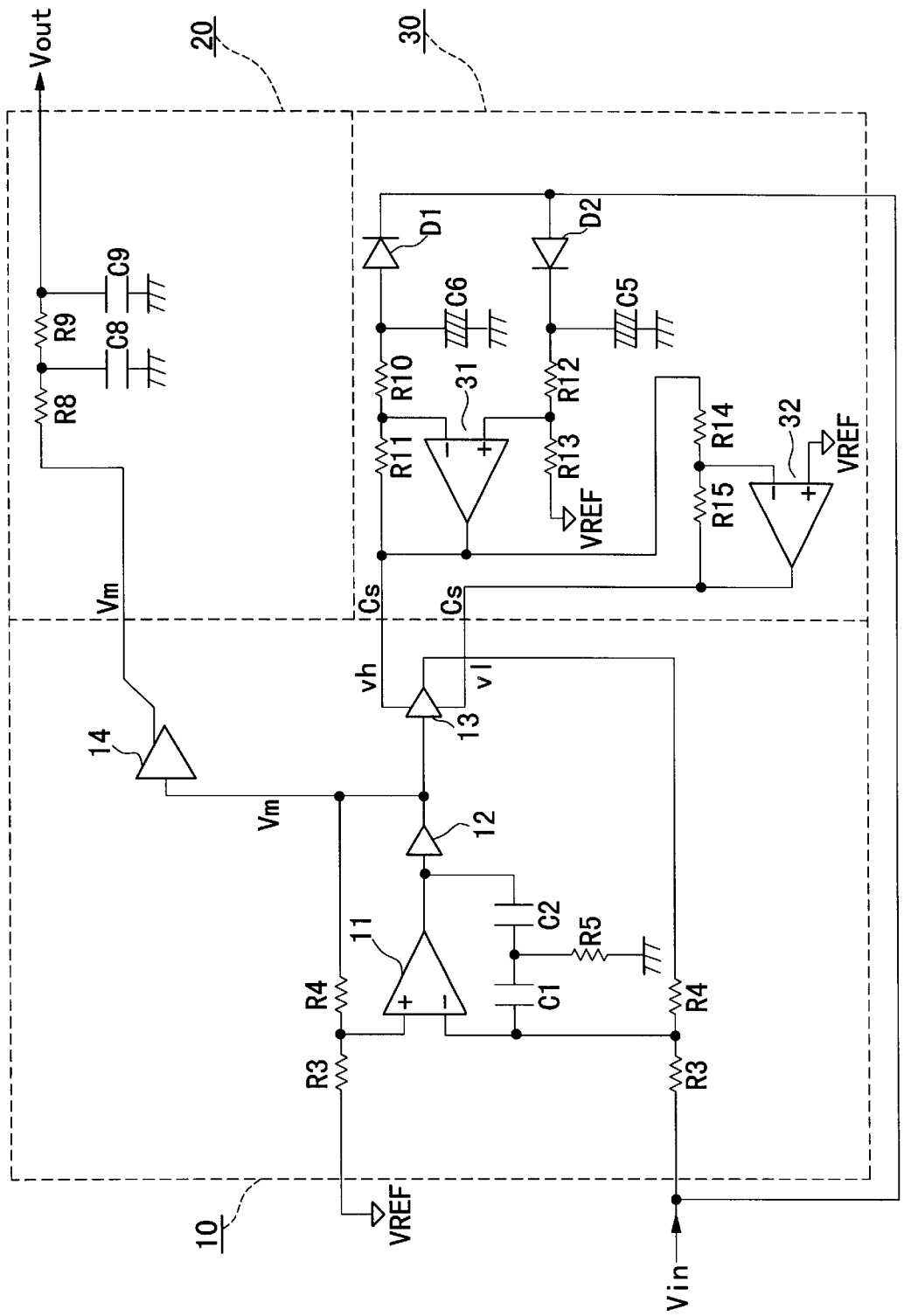
FIG. 6 is a circuit diagram showing a circuit configuration of the amplitude compression device of FIG. 5.

FIG. 6 is a circuit diagram showing internal circuit configurations of the amplitude compression device of the embodiment 2, wherein parts equivalent to those shown in FIG. 2 are designated by the same reference symbols.

Next, a description will be given with respect to operations of the amplitude compression device of the embodiment 2 with reference to FIG. 6.

In FIG. 6, an input signal Vin is supplied to the amplitude detector 30. In the amplitude detector 30, a positive peak voltage value of the input signal Vin is detected by the diode D2 and the capacitor C5, while a negative peak voltage value is detected by the diode D1 and the capacitor C6. Then, the operational amplifier (or comparator) 31 calculates an amplitude value of the input signal Vin, which is then inverted by the operational amplifier (or comparator) 32. Outputs of the comparators 31 and 32 are supplied the PWM modulator 10 as control signals (or control signal) Cs. Herein, the control signal Cs represents the amplitude value of the input signal Vin.

The input signal Vin is also supplied to the PWM modulator 10. So, the PWM modulator 10 effects pulse-width modulation on the input signal Vin to produce a pulse-width modulated signal Vm. Herein, a duty ratio of the pulse-width modulated signal Vm changes in response to a voltage value of the input signal Vin. In addition, a modulation factor of the pulse-width modulation is adjusted by a feedback value of the pulse-width modulated signal Vm, which is fed back to the inverting input of the operational amplifier 11 by the buffer 13. Like the foregoing embodiment 1 shown in FIG. 2, the "two-valued" pulse-width modulated signal Vm having high and low levels is supplied to an input of the buffer 13. As for the buffer 13, the positive source voltage vh and negative source voltage vl are respectively adjusted by the control signals Cs. Thus, the modulation factor is adjusted by the control signal Cs.

As described above, the control signal Cs corresponds to the amplitude value of the input signal Vin. Therefore, the modulation factor is adjusted in response to the amplitude value of the input signal Vin. If the amplitude value of the input signal Vin becomes large, the source voltages vh and vl increase so that the feedback value increases, therefore, the modulation factor decreases. Decrease of the modulation factor results in decreases of a variation rate of the duty ratio of the pulse-width modulated signal Vm against amplitude variations of the input signal Vin. As a result, an overall input/output gain of the amplitude compression device decreases. In contrast, if the amplitude value of the input signal Vin becomes small, the source voltages vh and vl decrease so that the feedback value decreases, therefore, the modulation factor increases. Increase of the modulation factor results in increase of the variation rate of the duty ratio of the pulse-width modulated signal Vm against the amplitude variations of the input signal Vin. Thus, the input/output gain increases.

As described above, the amplitude compression device of the embodiment 2 as a whole operates to compress the dynamic range. Like the foregoing embodiment 1, the amplitude compression device of the embodiment 2 has input/output characteristics, which is shown by the curve shown in FIG. 4.

In short, the embodiment 2 operates as follows:

The pulse-width modulation is effected on the input signal Vin. The modulation factor is controlled by the amplitude value of the input signal Vin, while the pulse-width modulated signal Vm is demodulated to produce the output signal Vout.

Like the foregoing embodiment 1, the embodiment 2 provides the amplitude compression device, which can be manufactured in a form of an IC in accordance with the CMOS process with ease. In addition, the embodiment 2 is capable of continuously varying the gain. Further, the embodiment 2 is capable of processing the "analog" input signal without converting it to digital signal. So, it is possible to configure the amplitude compression device without using the "expensive" circuit components such as the A/D converter, D/A converter and/or DSP.

Next, modifications for the embodiments 1, 2 will be described as follows:

(1) The embodiment 1 describes the amplitude compression device to have properties in which the input/output gain is increased while the amplitude of the output signal Vout is small, but the input/output gain is decreased while the amplitude of the output signal Vout is large. However, this invention is not limited to such embodiment 1. In other words, it is possible to change the properties of the amplitude compression device. That is, the input/output gain is increased while the amplitude of the output signal Vout is large, but the input/output gain is decreased while the amplitude of the output signal Vout is small. Concretely speaking, the amplitude compression device of the embodiment 1 is modified such that the amplitude detector 30 decreases the control signal Cs as the detected amplitude of the output signal Vout increases. In this case, when the amplitude of the output signal Vout increases, the source voltages vh, vl of the buffer 13 decrease so that the feedback value of the pulse-width modulated signal Vm decreases, therefore, the modulation factor increases. Therefore, it is possible to increase the input/output gain as the amplitude of the output signal Vout becomes large. In short, the embodiment 1 provides any types of the amplitude compression devices which are capable of adjusting the amplitude of the input signal Vin by adjusting the modulation factor of the pulse-width modulation, which is effected on the input signal Vin, based on the amplitude of the output signal Vout.

(2) The embodiment 2 describes the amplitude compression device to have properties in which the input/output gain is increased while the amplitude of the input signal Vin is small, but the input/output gain is decreased while the amplitude of the input signal Vin is large.

This invention is not limited to such embodiment 2. In other words, it is possible to change the properties of the amplitude compression device. That is, the input/output gain is increased while the amplitude of the input signal Vin is large, but the input/output gain is decreased while the amplitude of the input signal Vin is small. Concretely speaking, the amplitude compression device of the embodiment 2 is modified such that the amplitude detector 30 decreases the control signal Cs as the amplitude of the detected input signal Vin increases. In this case, when the amplitude of the input signal Vin increases, the source voltages vh, vl of the buffer 13 decrease so that the feedback value of the pulse-width modulated signal Vm decreases, therefore, the modulation factor increases. Therefore, it is possible to increase the input/output gain as the amplitude of the input signal Vin becomes large. In short, the embodiment 2 provides any types of the amplitude compression devices which are capable of effecting the pulse-width modulation having the modulation factor following the amplitude of the input signal Vin on the input signal Vin and which is capable of demodulating the pulse-width modulated signal Vm to produce the output signal Vout.

(3) Both of the embodiments 1 and 2 are designed in such a manner that the amplitude detector 30 detects the amplitude by detecting the positive and negative peak voltage values with respect to the demodulated signal V' (corresponding to the output signal Vout) or the input signal Vin. However, this invention is not limited in such a manner. That is, it is possible to detect the amplitude by detecting either the positive peak voltage value or negative peak voltage value.

[C] Embodiment 3

Next, a description will be given with respect to a full-wave rectifier in accordance with embodiment 3 of the invention.

Figure 7:
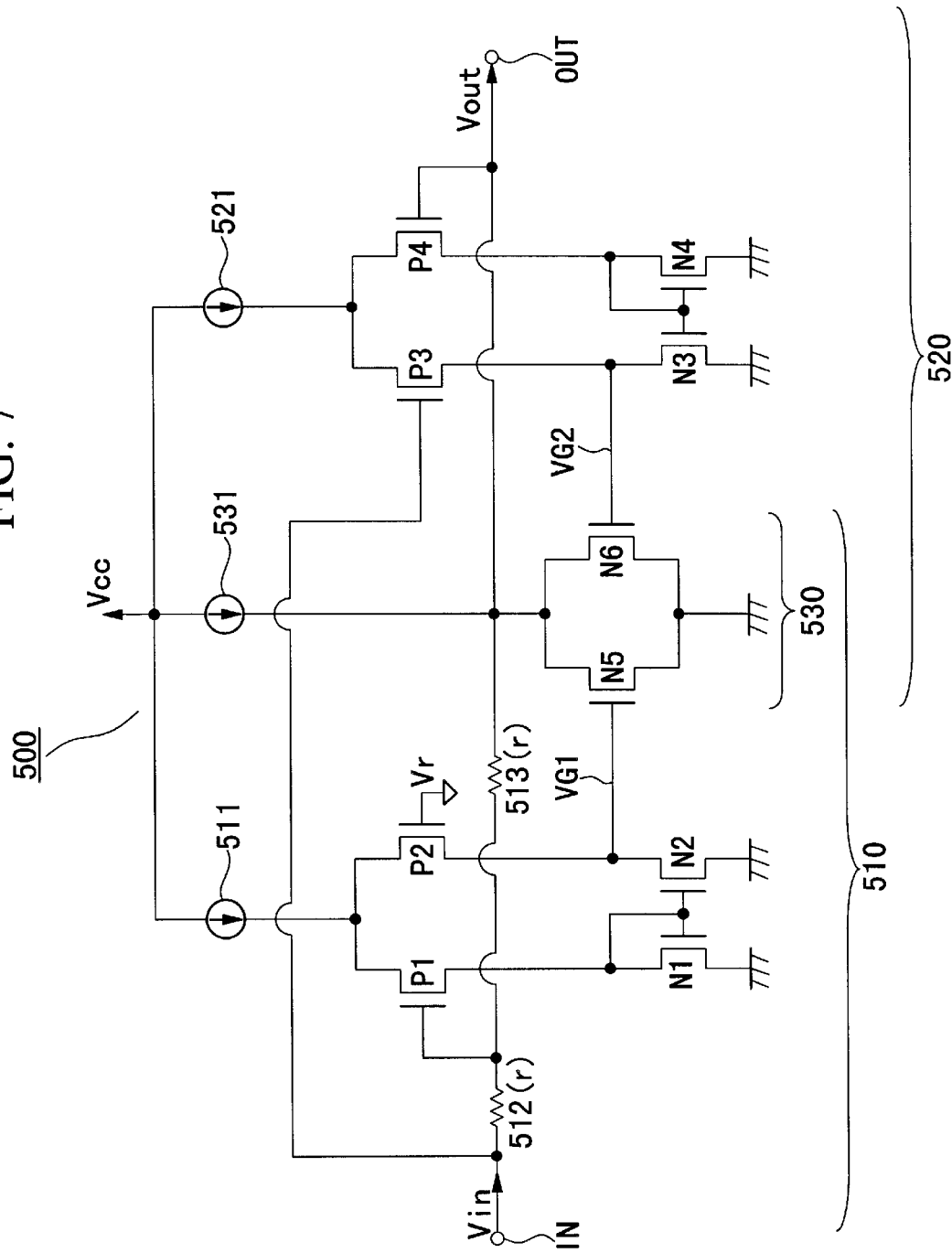
FIG. 7 is a circuit diagram showing a circuit configuration of a full-wave rectifier in accordance with embodiment 3 of the invention.

FIG. 7 is a circuit diagram showing a circuit configuration of a full-wave rectifier 500, which is mainly configured by an inversion amplifier 510, an amplifier 520 and an output section 530. Herein, the output section 530 is shared by the amplifiers 510 and 520.

The inversion amplifier 510 is configured by a constant current source 511, a pair of p-channel field-effect transistors P1, P2, a pair of n-channel field-effect transistors N1, N2 and resistors 512, 513 as well as the output section 530. Herein, the field-effect transistors (or FETs) N1, N2 act as negative loads. In the inversion amplifier 510, a gate of the p-channel FET P1 acts as an inverting input. An input signal Vin applied to an input terminal IN is supplied to such an inverting input of the inversion amplifier 510 via a resistor 512. In addition, an output signal Vout to be output from an output terminal OUT is fed back to the inverting input of the inversion amplifier 510 via a resistor 513. Reference voltage Vr is applied to a gate of the p-channel FET P2. Both of the resistors 512 and 513 have same resistance "r". Imaginary short-circuit is established between the gates of the p-channel FETs P1 and P2. So, the inversion amplifier 510 has a gain of "–1".

The amplifier 520 is configured by a constant current source 521, a pair of p-channel FETs P3, P4 and a pair of n-channel FETs N3, N4, which work as negative loads, as well as the output section 530. In the amplifier 520, a gate of the p-channel FET P4 acts as an inverting input. The output signal Vout is fed back to such an inverting input of the amplifier 520. As for the amplifier 520, the output signal Vout is fully subjected to negative feedback. So, the amplifier 520 functions as a voltage follower, whose gain is "1".

The output section 530 is configured by a constant current source 531 and a pair of n-channel FETs N5, N6. Herein, drains of the n-channel FETs N5, N6 are connected together to form a connection terminal, from which the output signal Vout is extracted. In addition, the drains of the n-channel FETs N5, N6 are connected to the gate of the p-channel FET P1 via the resistor 513. Further, a load resistor (not shown) is connected to the output terminal OUT. Incidentally, the constant current source 531 supplies a very small amount of current.

Gates of the n-channel FETs N5, N6 serve as control terminals. Herein, an output signal of the inversion amplifier 510 is supplied to the gate of the n-channel FET N5 which has gate voltage VG1, while an output signal of the amplifier 520 is supplied to the gate of the n-channel FET N6 which has gate voltage VG2. The n-channel FET N5 absorbs a current in response to the gate voltage VG1, while the n-channel FET N6 absorbs a current in response to the gate voltage VG2. By the way, the output signals of the amplifiers 510 and 520 differ from each other in phases by 180°. Normally, a first FET corresponding to one of the n-channel FETs N5 and N6 absorbs a current such as to reduce the output signal Vout in voltage to be lower than the reference voltage Vr. In this case, a second FET corresponding to another one of the FETs N5 and N6 operates to increase the output signal Vout. For this reason, the second FET is reduced in gate voltage, however, the output signal Vout is not increased in voltage because the first FET absorbs the current. Thus, the gate voltage of the second FET becomes identical to ground level, so the second FET is in an OFF state.

As a result, the output section 530 selects one of the output signals of the amplifiers 510 and 520, which is lower than the reference voltage Vr. So, the output section 530 outputs the selected signal as the output signal Vout. Thus, the current is absorbed by either the n-channel FET N5 or the n-channel FET N6 by means of the load resistor, so that the full-wave rectifier outputs the "negative" output signal Vout.

According to the embodiment 3 described above, it is possible to configure the full-wave rectifier 500 by using only the FETs. Therefore, it is possible to manufacture the full-wave rectifier in accordance with the MOS process with ease. Herein, the full-wave rectifier does not require diodes which are externally connected.

Figure 8:
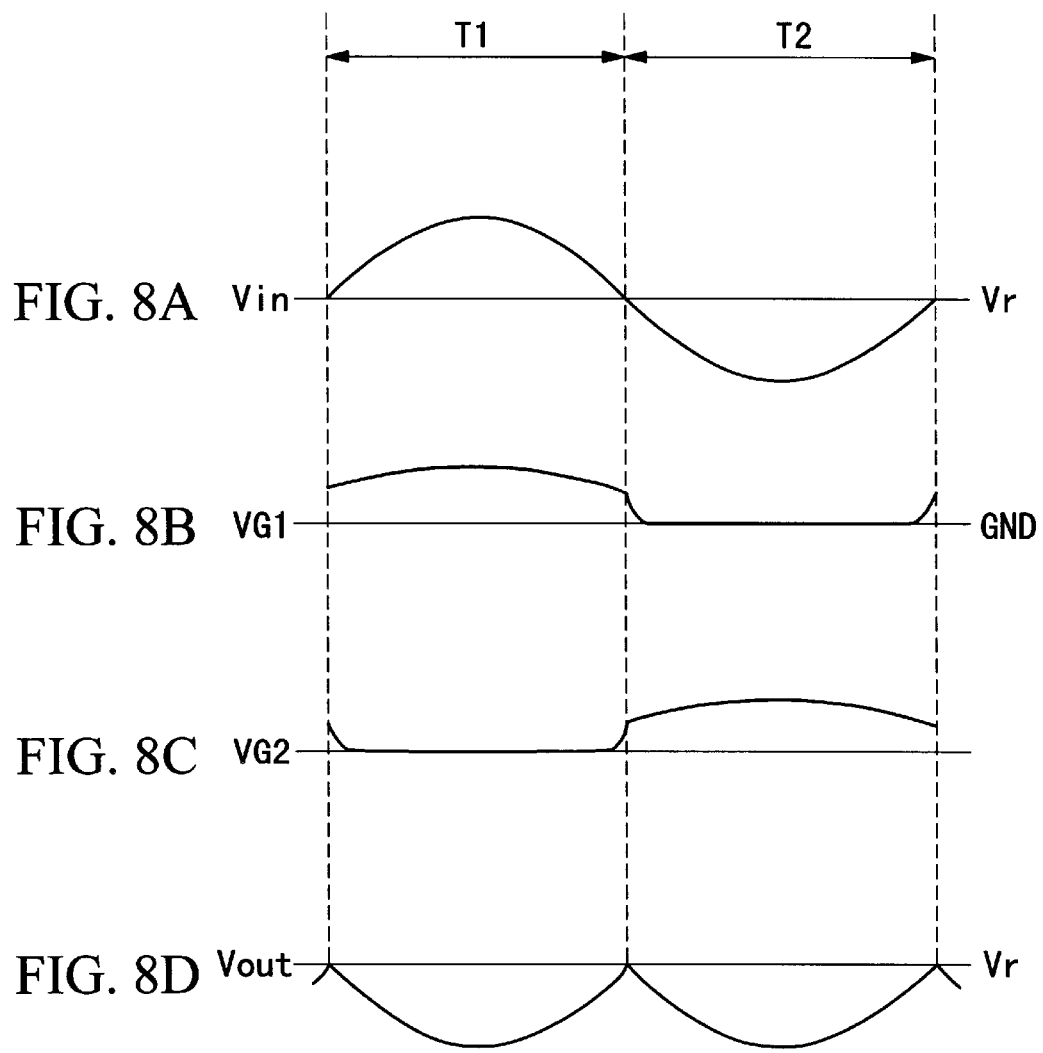
FIG. 8A shows a waveform of an input signal Vin applied to the full-wave rectifier of FIG. 7.
FIG. 8B shows a waveform of gate voltage VG1 in FIG. 7.
FIG. 8C shows a waveform of gate voltage VG2 in FIG. 7.
FIG. 8D shows a waveform of an output signal Vout in FIG. 7.

Next, a description will be given with respect to operations of the full-wave rectifier 500 with reference to time charts of FIGS. 8A to 8D. Suppose that the input signal Vin shown in FIG. 8A is applied to the amplifiers 510 and 520 respectively. In a duration TI, the input signal Vin is higher than the reference voltage Vr. The gate voltage VG1 of the n-channel FET N5 has the same phase of the input signal Vin. So, the gate voltage VG1 has a waveform of FIG. 8B in the duration T1. In this case, the n-channel FET N5 absorbs a current in response to the gate voltage VG1.

In the duration T1, the amplifier 520 operates to output a signal having a same phase of the input signal Vin. Therefore, the gate voltage VG2 decreases so that the n-channel FET N6 will not absorb the current. However, the n-channel FET N5 absorbs the current, so the voltage of the output signal Vout becomes lower than the reference voltage Vr. Thus, the gate voltage VG2 becomes identical to the ground level as shown in FIG. 8C, so that the n-channel FET N6 is in an OFF state. As a result, the output section 530 selects the output signal of the inversion amplifier 510, which is output as the output signal Vout in the duration T1. In the duration T1, the output signal Vout shown in FIG. 8D is equivalent to an inversion of the input signal Vin.

In a duration T2 in which the input signal is lower than the reference voltage Vr, the gate voltage VG2 applied to the gate of the n-channel FET N6 increases as shown in FIG. 8C. So, the drain of the n-channel FET N6 absorbs a current in response to the gate voltage VG2. This reduces the output signal Vout in voltage. In the inversion amplifier 510, the negative feedback is effected such that gate voltage of the p-channel FET P1 is identical to gate voltage of the p-channel FET P2. This increases drain voltage of the n-channel FET N5. Thus, the n-channel FET N5 is controlled such that the current being absorbed decreases. Therefore, the gate voltage VG1 of the n-channel FET N5 decreases. In this case, however, the n-channel FET N6 is in an ON state. So, even if the gate voltage VG1 of the n-channel FET N5 is reduced, the output signal Vout is not increased in voltage.

In the duration T2 described above, the amplifier 520 operates, while the inversion amplifier 510 stops operating. As a result, the output signal Vout shown in FIG. 8D has a same phase of the input signal Vin in the duration T2.

The full-wave rectifier of the present embodiment is designed such that the output section 530 is configured using the n-channel FETs N5, N6, each of which operates to absorb the current. As a result, the output section 530 selects one of the output signals of the amplifiers 510 and 520, which is lower than the reference voltage Vr. Thus, it is possible to produce the output signal Vout which is subjected to full-wave rectification. According to the present embodiment, all of the inversion amplifier 510, amplifier 520 and output section 530 of the full-wave rectifier 500 are configured using the FETs without using diodes. Thus, it is possible to manufacture the full-wave rectifier 500 in a form of an IC in accordance with the MOS process with ease.

[D] Embodiment 4

The aforementioned full-wave rectifier 500 of the embodiment 3 is designed to produce the "negative" output signal Vout. In contrast, a full-wave rectifier 600 of the embodiment 4 is designed to produce a "positive" output signal Vout.

Figure 9:
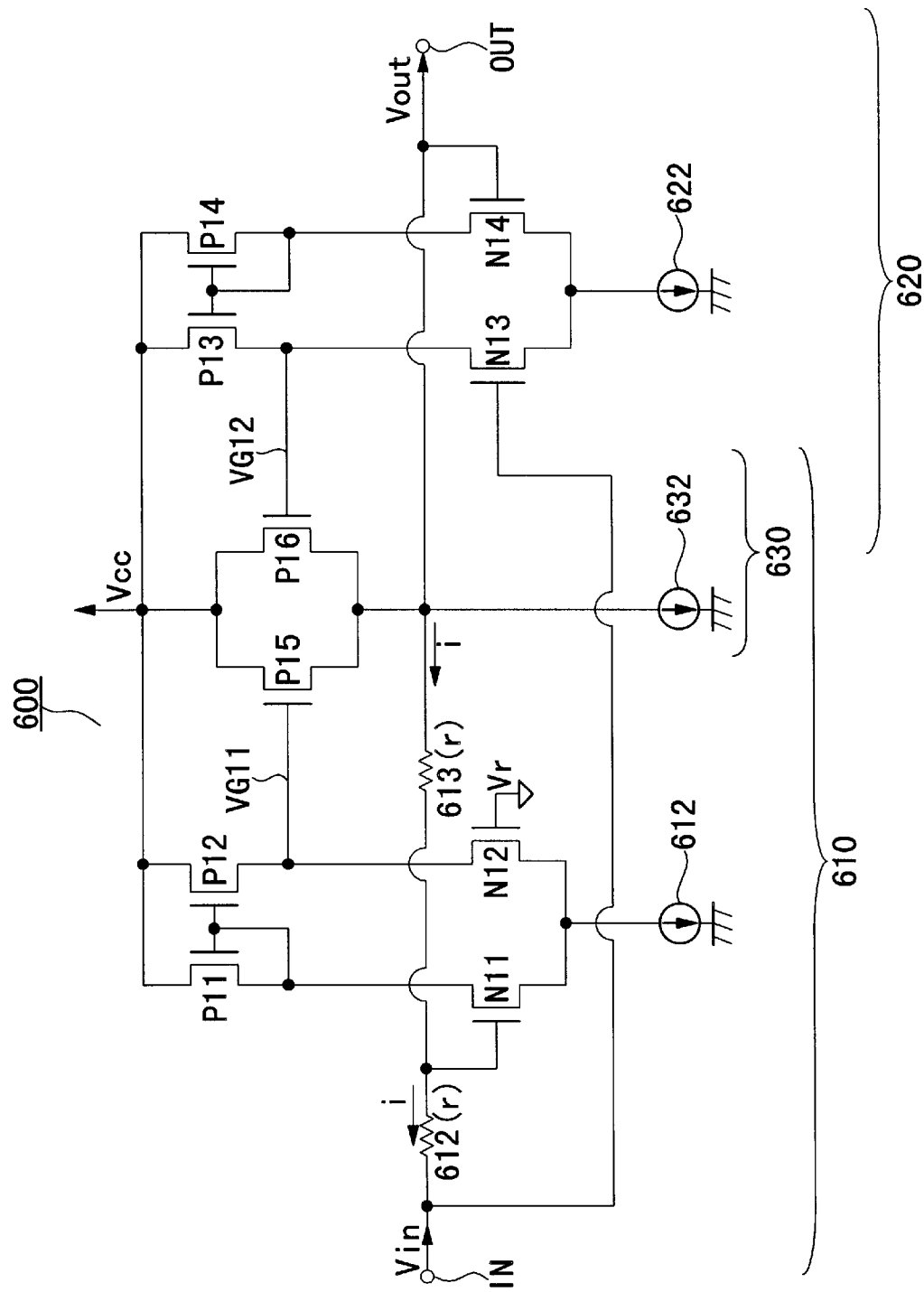
FIG. 9 is a circuit diagram showing a circuit configuration of a full-wave rectifier in accordance with embodiment 4 of the invention.

FIG. 9 is a circuit diagram showing circuit configurations of the full-wave rectifier 600 in accordance with the embodiment 4, wherein parts equivalent to those of FIG. 7 are designated by the same reference symbols.

The full-wave rectifier 600 of FIG. 9 is mainly configured by an inversion amplifier 610, an amplifier 620 and an output section 630, which are basically equivalent to the inversion amplifier 510, the amplifier 520 and the output section 530 shown in FIG. 7.

The inversion amplifier 610 is configured by a constant current source 612, a pair of n-channel FETs N11, N12, a pair of p-channel FETs P11, P12 which act as active loads, and resistors 612, 613 as well as the output section 630. In the inversion amplifier 610, a gate of the n-channel FET N11 acts as an inverting input. An input signal Vin is applied to such an inverting input of the inversion amplifier 610 via the resistor 612. In addition, an output signal Vout is fed back to the inverting input of the inversion amplifier 610 via the resistor 613. Reference voltage Vr is applied to a gate of the n-channel FET N12. Herein, imaginary short-circuit is established between the gates of the n-channel FETs N11, N12. So, the inversion amplifier 610 has a gain of "−1".

The amplifier 620 is configured by a constant current source 622, a pair of n-channel FETs N13, N14 and a pair of p-channel FETs P13, P14 which act as active loads as well as the output section 630. Like the foregoing amplifier 520 shown in FIG. 7, the amplifier 620 shown in FIG. 9 functions as a voltage follower, which has a gain of "1".

The output section 630 is configured by a constant current source 632 and a pair of p-channel FETs P15, P16, drains of which are connected together to form a connection terminal. The constant current source 632 is connected to such a connection terminal corresponding to the drains of the p-channel FETs P15, P16. Thus, the output signal Vout is extracted from the drains of the p-channel FETs P15, P16. In addition, the drains of the p-channel FETs P15, P16 are connected to the gate of the n-channel FET N11 via the resistor 613. Further, a load resistor (not shown) is connected to an output terminal OUT. Incidentally, the constant current source supplies a very small amount of current.

Gates of the p-channel FETs P15, P16 serve as control terminals. An output signal of the inversion amplifier 610 is supplied to the gate of the p-channel FET P15, while an output signal of the amplifier 620 is supplied to the gate of the p-channel FET P16. In the aforementioned embodiment 3 shown in FIG. 7, the n-channel FETs N5, N6 absorb currents in response to the gate voltages VG1, VG2 respectively. In contrast to the embodiment 3, the embodiment 4 is designed such that currents flow from the p-channel FETs P15, P16 in response to their gate voltages VG11, VG12 respectively.

Imaginary short-circuit is established between gates of the n-channel FETs N11, N12. Using an amount of current "i" which flows toward the input terminal IN, the output signal Vout is given by an equation (1), as follows:

$$Vout = i \cdot r + Vr \tag{1}$$

Herein, i is given by an equation (2) as follows:

$$i = (Vr - Vin)/r \tag{2}$$

Thus, Vout is given by an equation (3) as follows:

$$Vout = 2Vr - Vin \tag{3}$$

Therefore, Vout is greater than Vr by an amount of voltage by which Vin is lower than Vr.

By the way, the output signals of the amplifiers 610, 620 differ from each other in phases by 180°. Normally, a first FET corresponding to one of the p-channel FETs P15, P16 makes the current to flow in such a way that the voltage of the output signal Vout becomes greater than the reference voltage Vr. In this case, a second FET corresponding to another one of the p-channel FETs P15, P16 operates to reduce the output signal Vout in voltage. For this reason, the gate voltage is increased but the first FET outputs the current, so the output signal Vout will not be reduced in voltage. Thus, the gate voltage of the second FET becomes identical to source voltage Vcc, so that the second FET is in an OFF state.

Namely, the output section 630 selects one of the output signals of the amplifiers 610, 620, which is higher than the reference voltage Vr. Thus, it is possible to obtain the output signal Vout, having the same phase of the input signal Vin, which is subjected to full-wave rectification.

According to the present embodiment described above, it is possible to configure the full-wave rectifier 600 by using only the FETs. So, it is possible to manufacture the full-wave rectifier in a form of an IC in accordance with the MOS process with ease, wherein the full-wave rectifier does not require diodes which are externally connected.

Figure 10:
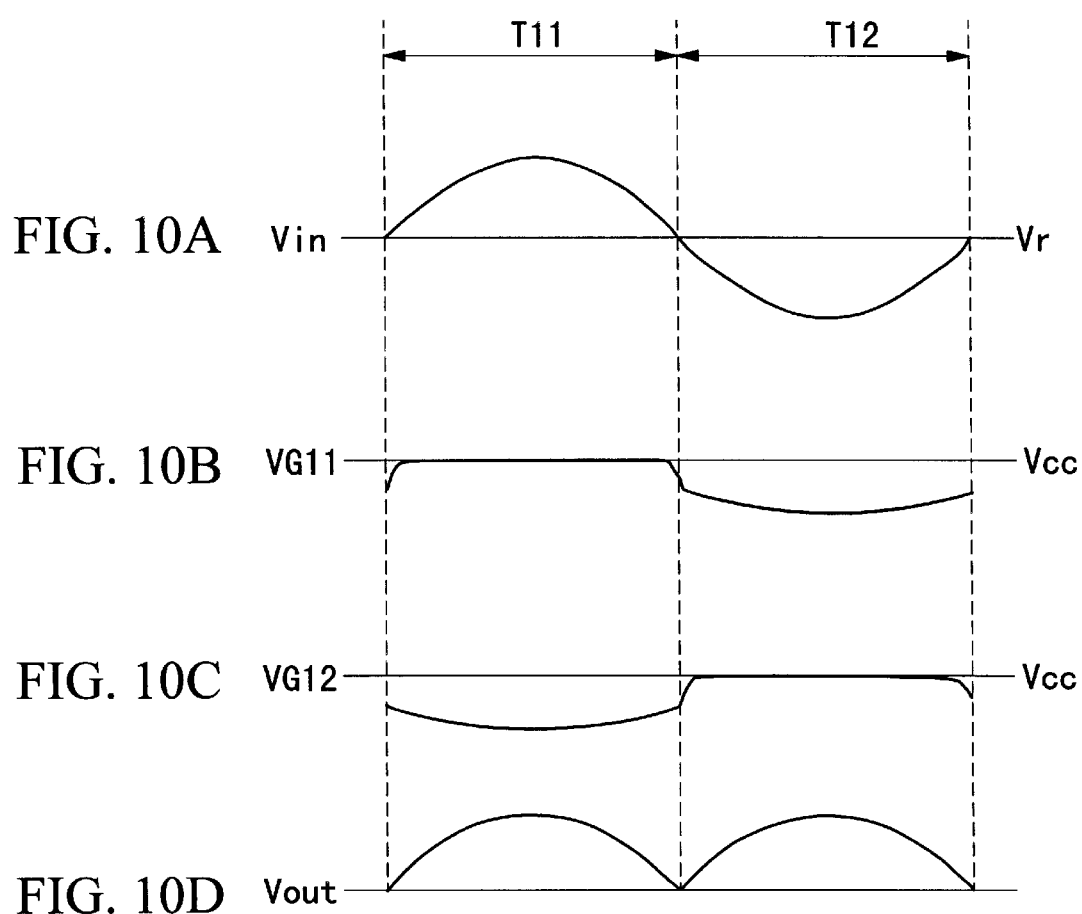
FIG. 10A shows a waveform of an input signal Vin applied to the full-wave rectifier of FIG. 9.
FIG. 10B shows a waveform of gate voltage VG11 in FIG. 9.
FIG. 10C shows a waveform of gate voltage VG12 in FIG. 9.
FIG. 10D shows a waveform of an output signal Vout in FIG. 9.
Figure 11:
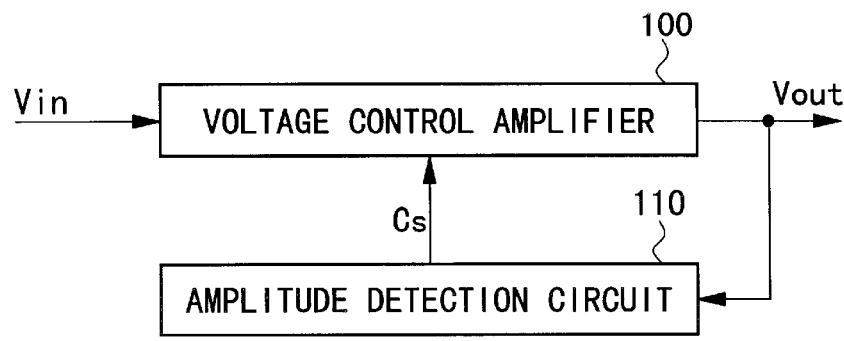
FIG. 11 is a block diagram showing a first example of the amplitude compression device.
Figure 12:
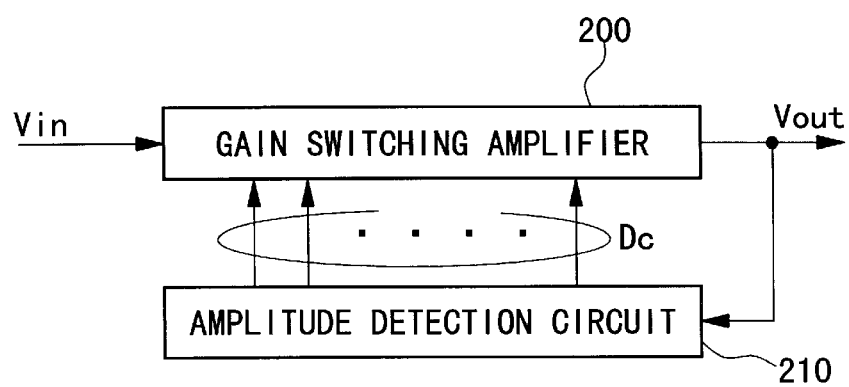
FIG. 12 is a block diagram showing a second example of the amplitude compression device.
Figure 13:
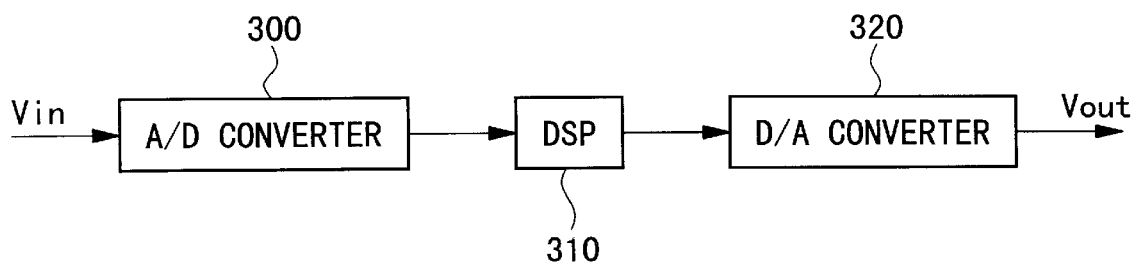
FIG. 13 is a block diagram showing a third example of the amplitude compression device.

Next, a description will be given with respect to operations of the full-wave rectifier 600 of the embodiment 4 with reference to time charts of FIGS. 10A to 10D. An input signal Vin shown in FIG. 10A is applied to the amplifiers 610 and 620 respectively. In a duration T11, voltage of the input signal Vin is greater than the reference voltage Vr. Gate voltage VG12 of the p-channel FET P16 has a reverse phase as compared with the input signal Vin. In the duration T11, the gate voltage VG12 varies as shown in FIG. 10C. In this case, the p-channel FET P16 makes a current to flow in response to the gate voltage VG12.

The inversion amplifier 610 operates to output a signal whose phase is reverse to the phase of the input signal Vin. Therefore, gate voltage VG11 of the p-channel FET P15 increases, so that an amount of current that flows from the p-channel FET P15 decreases. However, a current flows from the p-channel FET P16, so that the voltage of the output signal Vout will not become lower than the reference voltage Vr. For this reason, the gate voltage VG11 becomes identical to the source voltage Vcc as shown in FIG. 10B, so that the p-channel FET P15 is in an OFF state. In the duration T11, the output section 630 selects the output signal of the amplifier 620, which is output as the output signal Vout. As shown in FIG. 10D, the output signal Vout has the same phase of the input signal Vin in the duration T11.

In a duration T12, the voltage of the input signal Vin becomes lower than the reference voltage Vr. So, the gate voltage VG11 of the p-channel FET P15 varies in the duration T12 as shown in FIG. 10B. Therefore, a current flows from the drain of the p-channel FET P15 in response to the gate voltage VG11. This increases the output signal Vout in voltage. In the amplifier 620, negative feedback is effected in such a way that gate voltage of the n-channel FET N13 is identical to gate voltage of the n-channel FET N14. As a result, the p-channel FET P16 is controlled such that the current flowing from the p-channel FET P16 is reduced. However, the p-channel FET P15 is in an ON state. Therefore, even if the gate voltage VG12 increases (see FIG. 10C), the output singal Vout is not reduced in voltage.

In the duration T12, the inversion amplifier 610 operates while the amplifier 620 stops operating. As shown in FIG. 10D, the output signal Vout has a reverse phase as compared with the input signal Vin in the duration T12.

According to the present embodiment described above, the output section 630 is configured using the p-channel FETs P15 and P16, each of which operates such that the current flows therefrom. As a result, the output section 630 selects one of the output signals of the amplifiers 610 and 620, which is greater than the reference voltage Vr. Thus, it is possible to obtain the output signal Vout which is subjected to full-wave rectification. In the embodiment 4, all of the inversion amplifier 610, amplifier 620 and output section 630 of the full-wave rectifier 600 are configured by the FETs without using the diodes. So, it is possible to manufacture the full-wave rectifier 600 in a form of an IC in accordance with the MOS process with ease.

Incidentally, the output section 530 of the embodiment 3 is configured by the constant current source 531 and the n-channel FETs N5, N6, while the output section 630 of the embodiment 4 is configured by the constant current source 632 and the p-channel FETs P15, P16. However, those output sections 530 and 630 are equivalent to each other in operations. Because, the output section 530 selects and outputs one of the output signals of the amplifiers 510 and 520, while the output section 630 selects and outputs one of the output signals of the amplifiers 610 and 620. That is, this invention is not limited to those embodiments. In other words, this invention provides any types of the full-wave rectifiers, each of which has a function to adequately select one of the output signals of the amplifiers.

Lastly, the aforementioned embodiments are designed to use the FETs as active components, for example. However, it is possible to use p-n-p bipolar transistors instead of the p-channel FETs, and it is possible to use n-p-n bipolar transistors instead of the n-channel FETs.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. An amplitude adjustment device which adjusts an amplitude of an input signal to produce an output signal, comprising:

pulse-width modulation means for effecting pulse-width modulation on the input signal to produce a pulse-width modulated signal;

demodulation means for demodulating the pulse-width modulated signal to produce the output signal;

amplitude detection means for detecting a lower amplitude peak and an upper amplitude peak of said output signal; and control means for controlling a modulation factor of the pulse-width modulation based on a detection result of the amplitude detection means, wherein a period of said pulse-width modulated output signal is controlled based on a level therebetween said lower amplitude peak and an upper amplitude peak of said output signal.

2. An amplitude adjustment device according to claim 1, wherein the pulse-width modulation means contains a negative feedback path for feeding back the pulse-width modulated signal to an input thereof, so that the control means controls the modulation factor by adjusting a feedback value of the negative feedback path.

3. An amplitude adjustment device according to claim 2, wherein the control means contains a buffer, which is provided on the negative feedback path of the pulse-width modulation means, and wherein source voltage, applied to the buffer is varied in response to the detection result of the amplitude detection means.

4. An amplitude adjustment device which adjusts an amplitude of an input signal to produce an output signal, comprising:

pulse-width modulation means for effecting pulse-width modulation on the input signal to produce a pulse-width modulated signal;

demodulation means for demodulating the pulse-width modulated signal to produce the output signal;

amplitude detection means for detecting a lower amplitude peak and an upper amplitude peak of said input signal; and control means for controlling a modulation factor of the pulse-width modulation based on a detection result of the amplitude detection means, wherein a period of said pulse-width modulated input signal is controlled based on a level therebetween said lower amplitude peak and said upper amplitude peak of said input signal.

5. An amplitude adjustment device according to claim 4, wherein the pulse-width modulation means contains a negative feedback path for feeding back the pulse-width modulated signal to an input thereof, so that the control means controls the modulation factor by adjusting a feedback value of the negative feedback path.

6. An amplitude adjustment device according to claim 5, wherein the control means contains a buffer, which is provided on the negative feedback path of the pulse-width modulation means, and wherein source voltage applied to the buffer is varied in response to the detection result of the amplitude detection means.

7. An amplitude compression device comprising:
pulse-width modulation means for effecting pulse-width modulation on an input signal to produce a pulse-width modulated signal;
demodulation means for demodulating the pulse-width modulated signal to produce an output signal;
amplitude detection means for detecting a lower amplitude peak and an upper amplitude peak of said output signal; and
control means for controlling the pulse-width modulation means in such a way that a modulation factor of the pulse-width modulation decreases as the width between the lower amplitude peak and the upper amplitude peak detected by the amplitude detection means increases.

8. An amplitude compression device comprising:
pulse-width modulation means for effecting pulse-width modulation on an input signal to produce a pulse-width modulated signal;
demodulation means for demodulating the pulse-width modulated signal to produce an output signal;
amplitude detection means for detecting a lower amplitude peak and an upper amplitude peak of said input signal; and
control means for controlling the pulse-width modulation means in such a way that a modulation factor of the pulse-width modulation decreases as the width between the lower amplitude peak and the upper amplitude peak detected by the amplitude detection means increases.

9. An amplitude expansion device comprising:
pulse-width modulation means for effecting pulse-width modulation on an input signal to produce a pulse-width modulated signal;
demodulation means for demodulating the pulse-width modulated signal to produce an output signal;
amplitude detection means for detecting a lower amplitude peak and an upper amplitude peak of said output signal; and
control means for controlling the pulse-width modulation means in such a way that a modulation factor of the pulse-width modulation increases as the width between the lower amplitude peak and the upper amplitude peak detected by the amplitude detection means increases.

10. An amplitude compression device comprising:
pulse-width modulation means for effecting pulse-width modulation on an input signal to produce a pulse-width modulated signal;
demodulation means for demodulating the pulse-width modulated signal to produce an output signal;
amplitude detection means for detecting a lower amplitude peak and an upper amplitude peak of said input signal; and
control means for controlling the pulse-width modulation means in such a way that a modulation factor of the pulse-width modulation increases as the width between the lower amplitude peak and the upper amplitude peak detected by the amplitude detection means increases.

11. An amplitude compression device comprising:
pulse-width modulation means for effecting pulse-width modulation on an input signal to produce a pulse-width modulated signal, wherein the pulse-width modulation means contains a negative feedback loop to feed back a feedback value corresponding to a fraction of the pulse-width modulated signal;
a first low-pass filter for inputting the pulse-width modulated signal to produce an output signal;
a second low-pass filter for demodulating an inversion of the pulse-width modulated signal to produce a demodulated signal;
a first hold circuit for detecting a negative peak voltage value of the demodulated signal;
a second hold circuit for detecting a positive peak voltage value of the demodulated signal;
a subtraction circuit for subtracting the negative peak voltage value from the positive peak voltage value to produce an amplitude value of the demodulated signal;
an inversion circuit for inverting an output of the subtraction circuit; and
modulation factor adjusting means for adjusting a modulation factor of the pulse-width modulation by adjusting the feedback value fed back through the negative feedback loop on the basis of the output of the subtraction circuit and an output of the inversion circuit.

12. An amplitude compression device according to claim 11 wherein the pulse-width modulation means is configured using an operational amplifier having an inverting input which inputs the input signal and to which the feedback value is fed back.

13. An amplitude compression device according to claim 11 wherein the first low-pass filter is of a second order.

14. An amplitude compression device according to claim 11 wherein the modulation factor adjusting means is configured by a buffer in which positive source voltage corresponds to the output of the subtraction circuit while negative source voltage corresponds to the output of the inversion circuit, so that the buffer inputs the pulse-width modulated signal to output the feedback value, which is controlled based on the output of the subtraction circuit and the output of the inversion circuit.

15. An amplitude compression device comprising:
pulse-width modulation means for effecting pulse-width modulation on an input signal to produce a pulse-width modulated signal, wherein the pulse-width modulation means contains a negative feedback loop to feed back a feedback value corresponding to a fraction of the pulse-width modulated signal;
a low-pass filter for inputting the pulse-width modulated signal to produce an output signal;
a first hold circuit for detecting a negative peak voltage value of the input signal;
a second hold circuit for detecting a positive peak voltage value of the input signal;
a subtraction circuit for subtracting the negative peak voltage value from the positive peak voltage value to produce an amplitude value of the input signal;
an inversion circuit for inverting an output of the subtraction circuit; and modulation factor adjusting means for adjusting a modulation factor of the pulse-width modulation by adjusting the feedback value fed back through the negative feedback loop on the basis of the output of the subtraction circuit and an output of the inversion circuit.

16. An amplitude compression device according to claim 15 wherein the pulse-width modulation means is configured using an operational amplifier having an inverting input which inputs the input signal and to which the feedback value is fed back.

17. An amplitude compression device according to claim 15 wherein the low-pass filter is of a second order.

18. An amplitude compression device according to claim 15 wherein the modulation factor adjusting means is configured by a buffer in which positive source voltage corresponds to the output of the subtraction circuit while negative source voltage corresponds to the output of the inversion circuit, so that the buffer inputs the pulse-width modulated signal to output the feedback value, which is controlled based on the output of the subtraction circuit and the output of the inversion circuit.

* * * * *